United States Patent [19]
Ruetz

[11] Patent Number: 5,805,002
[45] Date of Patent: Sep. 8, 1998

[54] SLOW TRANSITION TIME PHASE FREQUENCY DETECTOR AND METHOD

[75] Inventor: John Eric Ruetz, San Bruno, Calif.

[73] Assignee: IC Works, Inc., San Jose, Calif.

[21] Appl. No.: 697,316

[22] Filed: Aug. 22, 1996

Related U.S. Application Data

[63] Continuation of Ser. No. 377,153, Jan. 24, 1995, abandoned.

[51] Int. Cl.$^6$ .................................................. H03L 7/06
[52] U.S. Cl. ........................ 327/159; 327/48; 327/49; 327/161; 327/163; 331/1 A; 331/25
[58] Field of Search .............................. 327/47, 48, 49, 327/39, 40, 156, 157, 158, 159, 160, 161, 162, 163, 7, 10, 12, 5, 141, 231, 41–43; 331/1 A, 17, 25, 57, 27

[56] References Cited

U.S. PATENT DOCUMENTS

| | | | |
|---|---|---|---|
| 4,291,274 | 9/1981 | Suzuki et al. | 327/7 |
| 4,322,643 | 3/1982 | Preslar | 327/5 |
| 4,598,217 | 7/1986 | Predina et al. | 327/12 |
| 4,771,251 | 9/1988 | Allen et al. | 331/57 |
| 4,804,929 | 2/1989 | Kato et al. | 331/57 |
| 4,816,777 | 3/1989 | Benhamida | 331/57 |
| 4,901,026 | 2/1990 | Phillips et al. | 327/10 |
| 4,945,303 | 7/1990 | Hwang et al. | 327/457 |
| 5,081,429 | 1/1992 | Atriss et al. | 331/57 |
| 5,173,927 | 12/1992 | Strömmer et al. | 327/47 |
| 5,175,512 | 12/1992 | Self | 331/57 |
| 5,208,546 | 5/1993 | Nagaraj | 327/157 |
| 5,220,201 | 6/1993 | Kawasaki et al. | 327/156 |
| 5,355,097 | 10/1994 | Scott et al. | 358/520 |
| 5,440,277 | 8/1995 | Ewen et al. | 331/176 |
| 5,485,126 | 1/1996 | Gersbach et al. | 331/57 |
| 5,502,411 | 3/1996 | Matsuki et al. | 327/157 |

*Primary Examiner*—Kenneth B. Wells
*Attorney, Agent, or Firm*—Robert P. Sabath; Edward B. Weller

[57] ABSTRACT

A phase frequency detection circuit and method in a phase lock loop circuit uses delay circuits to limit the period of expression of up and down signals which adjust the output frequency of a voltage controlled oscillator. The pulse frequency detection circuit includes cross-linked latches to drive logic gates which produce output signals for adjusting the output frequency of a voltage controlled oscillator and delay circuitry connected to the outputs of particular logic gates for selective nullification of up and down control signals to a voltage controlled oscillator.

4 Claims, 6 Drawing Sheets

SLOW TRANSITION TIME PHASE FREQUENCY DETECTOR AND METHOD

This application is a Continuation of application Ser. No. 08/377,153, filed on Jan. 24, 1995, now abandoned.

CROSS-REFERENCE TO RELATED APPLICATIONS

This application is related to a co-pending patent application filed on the same day herewith and having the same inventorship as herein, and respectively entitled "LOW JITTER VOLTAGE CONTROLLED OSCILLATOR (VCO) CIRCUIT." This co-pending patent application has respective Ser. No. 08/377,269. This patent application is assigned to the same assignee as herein, and is incorporated herein by reference in its entirety.

TECHNICAL FIELD

The present invention relates to phase frequency detectors and methods, and particularly slow transition time phase frequency detectors and methods in phase lock loops.

BACKGROUND OF THE INVENTION

Slow transition time phase frequency detectors in phase lock loops are desirable to enable use of low frequency, low cost circuits in connection with the phase lock loops. Such slow transition times are currently achieved with large capacitors connected within phase lock loop circuitry either as separate components or as part of the on-chip design. However, fabricating such capacitors on a semiconductor chip consumes valuable chip real estate, and the use of large filter components is expensive.

Alternatively, slow transition times in switching between different operational frequencies in electronic systems is achieved by use of specialized circuitry to produce low charge pump current levels. However, the lowest current is limited by the noise floor and the ability of the phase lock loop to function in a noisy environment. In other words, even with specialized circuitry to produce low charge pump current levels, because of noise considerations, a practical limit exists below which currents are overwhelmed by noise.

SUMMARY OF THE INVENTION

According to the present invention, a slow transition time phase frequency detector and method for use in phase lock loops is developed which incorporates a timer circuit to limit the maximum output time for production of phase frequency detector outputs. The phase frequency detector circuitry according to one embodiment of the present invention can be used in computer motherboards having a requirement of slow transitions from one frequency to another, as in the case of personal computers (i.e., "PC's") adapted for low power consumption, referred to as green PC's.

A phase frequency detection circuit and method according to the present invention are employed in a phase lock loop circuit including delay circuits to limit the period of up and down signals which adjust the output frequency of a voltage controlled oscillator. The pulse frequency detection circuit includes flip-flops to drive logic circuitry which produces output signals for adjusting the output frequency of a voltage controlled oscillator and delay circuitry connected to the outputs of particular logic circuitry for selective nullification of up and down control signals.

DETAILED DESCRIPTION OF THE PREFERRED EMBODIMENTS

Figure 1:
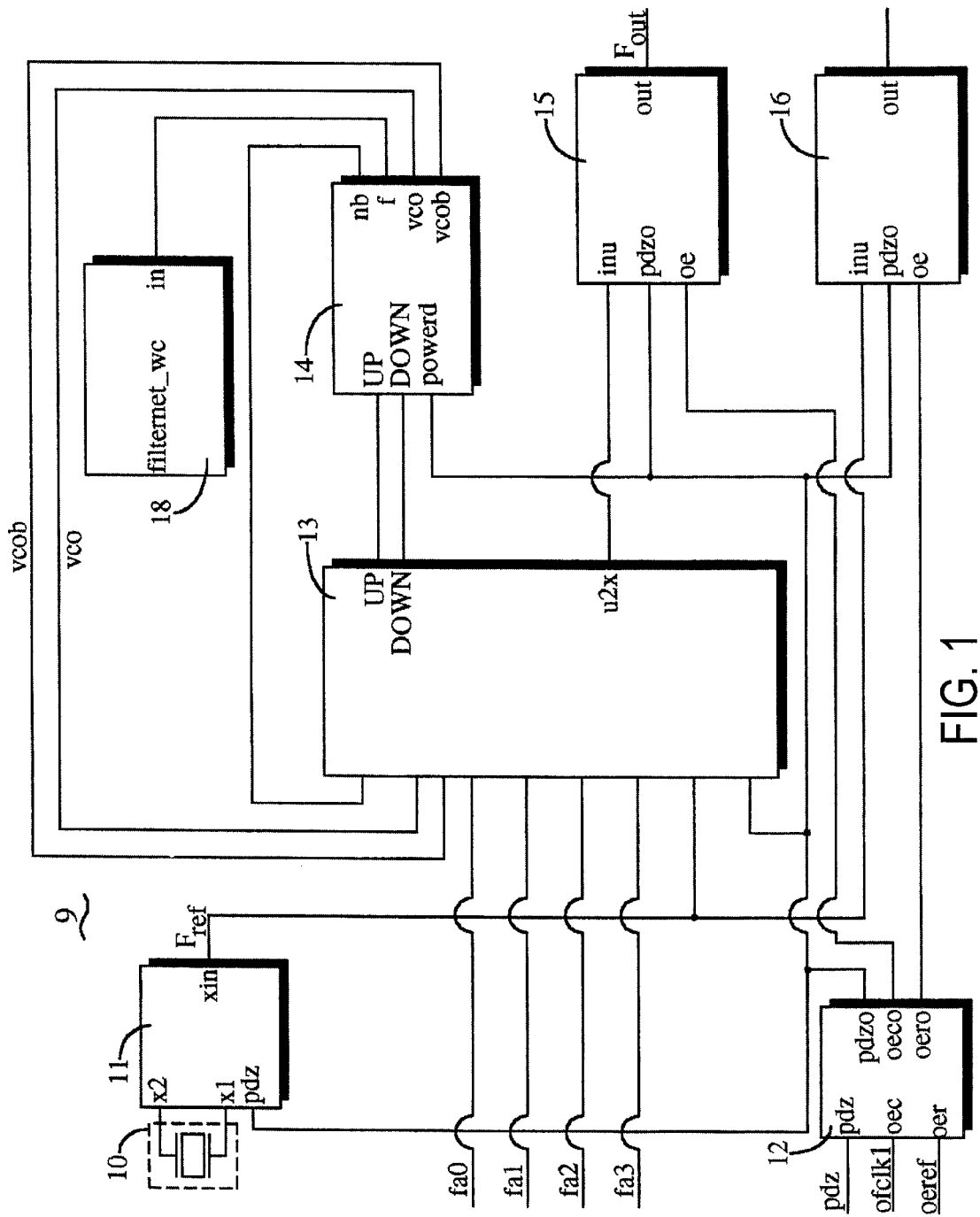
FIG. 1 is a circuit diagram of an electric circuit system including a phase lock loop and a phase frequency detector circuit according to the present invention.

FIG. 1 is a diagram of an electric circuit system 9 including a crystal 10, a crystal interface circuit 11, an input buffer 12, a phase lock loop subcircuit 13 (DIG1394_WD), an analog circuit 14 (PLL_ANAR), output buffer blocks 15–16, and a filter circuit 18. Crystal oscillator 10 produces a reference frequency (Fref) of 14.31818 MHz for example and is connected at first and second inputs (i.e., x1 and x2) of crystal interface circuit 11. Crystal interface circuit 11 includes respective terminals x1, x2, pdz and xin. Terminals x1 and x2 are connected to opposite sides of crystal 10. Input buffer 12 includes respective terminals pdz, ofclk1, oeref, pdzo oeco, and oero. Input buffer 12 receives input signals, including a pdz signal at the pdz terminal of input buffer 12, a clock signal ofclk1 at terminal oec, and a reference signal oeref at terminal oer. Terminal pdzo of input buffer pdzo is connected to terminal pdz of crystal interface circuit 11. Filter circuit 18 is designated as filter ne_wc and includes an input terminal "in". Filter circuit 18 is connected to analog circuit 14 for converting the output of the charge pump (not shown) into a slowly varying voltage as an input to a voltage controlled oscillator (VCO) circuit within analog circuit 14. Analog circuit 14 includes respective terminals UP, DOWN, powered, nb, f, vco, and vcob. Input terminal "in" of filter circuit 18 is connected to terminal nb of analog circuit 14. Phase lock loop subcircuit 13 includes respective terminals UP, DOWN, and u2x. UP and DOWN terminals of phase lock loop subcircuit 13 are connected to UP and DOWN terminals of analog circuit 14. Terminals nb, vco, and vcob are connected to phase lock loop subcircuit 13. Output buffer blocks 15 and 16 each have respective terminals inv, pdzo, oe, and out. The pdzo terminals of respective output buffer blocks 15 and 16 are connected to each other and to the powered terminal of analog circuit 14. Terminal inv of output buffer block 15 is connected to terminal u2x of phase lock loop subcircuit 13. Terminals oe of output buffer blocks 15 and 16 are connected to respective ueco and uero terminals of input buffer 12. Crystal interface circuit 11 and its terminal pdz are connected to terminal pdzo of input buffer 12, to the pdzo terminal of output buffer block 16, to the pdzo terminal of output buffer block 15, and to the powered terminal of analog circuit 14. The output terminal xin on crystal interface circuit 11 produces a signal Fref and is connected to terminal inv of output buffer 16. The vco signal is an output from analog circuit 14. Analog circuit 14 is connected to phase lock loop subcircuit 13, both to receive vco and Fout signals. Crystal interface circuit 11 produces an output signal at xin at a frequency equaling Fref. Output buffer blocks 15 and 16 can be connected to drive predetermined external loads (not shown) at selected frequencies given by the equation, Fout=(Fref*M*P)/(N*O), where M and P are feedback divider values, N is an input divider value, and O is an output divider value, as detailed in the description of phase lock loop subcircuit 13 below.

Figure 2:
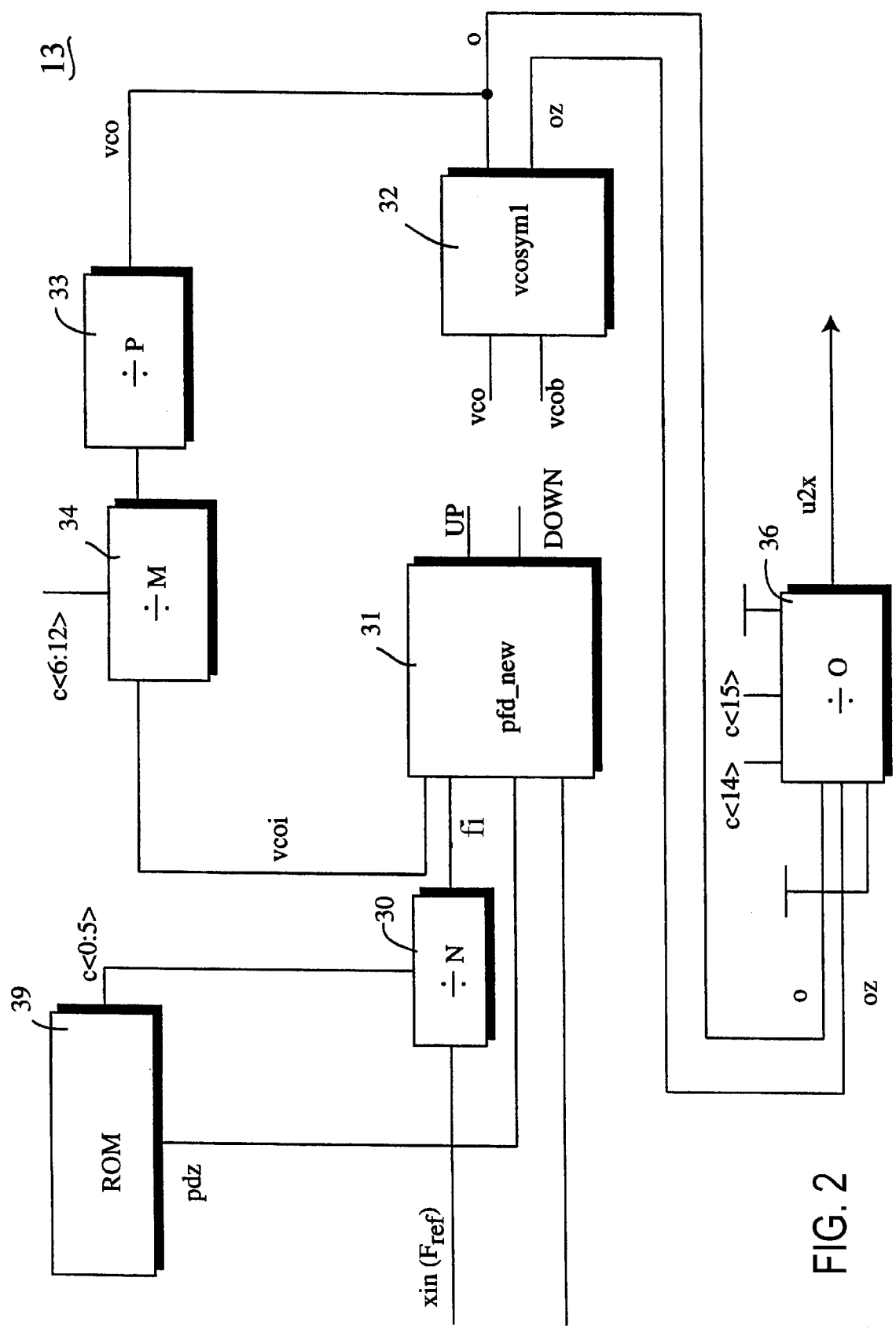
FIG. 2 is a circuit diagram of the phase lock loop circuit in FIG. 1, according to the present invention.

FIG. 2 is a diagram of the details of phase lock loop subcircuit 13 shown in FIG. 1. In particular, phase lock loop subcircuit 13 includes a first divider 30, a phase frequency detector circuit 31, a duty cycle circuit 32, a second divider 33, a third divider 34, a fourth divider 36, and read only memory 39. Read only memory 39 produces output bit values c<0:12>. Bits 0–5 are connected to first divider 30. Bits 6–12 are connected to third divider 34. Thus, divide-by values are set for first and third dividers 30 and 34 respectively. Phase lock loop subcircuit 13 receives the vco signal output from analog circuit 14 and xin signal input from crystal interface circuit 11 for comparison, respectively at duty cycle circuit 32 and first divider 30. The output of first divider 30 is connected to phase frequency detector circuit 31 to provide input frequency signal fi. According to one embodiment of the present invention, first divider 30 divides the frequency (Fret from crystal interface circuit 11) by "N" to produce an output frequency Fref/N which is equal to "fi." Duty cycle circuit 32 provides input signals vco and vcob and provides improved signals o and oz to second divider 33 and fourth divider 36. Fourth divider 36 divides the frequencies of input signals o and oz by "O" for provision to output circuit 37, which in turn drives output buffer blocks 15–17 of FIG. 1. Second divider 33 divides the frequencies of input signal o and oz by a selected value "P." According to one embodiment of the present invention, P=2. Second divider 33 is connected to third divider 34 to produce an output frequency signal vcoi for input to phase frequency detector circuit 31. Third divider 34 divides the frequency signal produced by second divider 33 by "M," determined by a value provided by read only memory 39.

Figure 3:
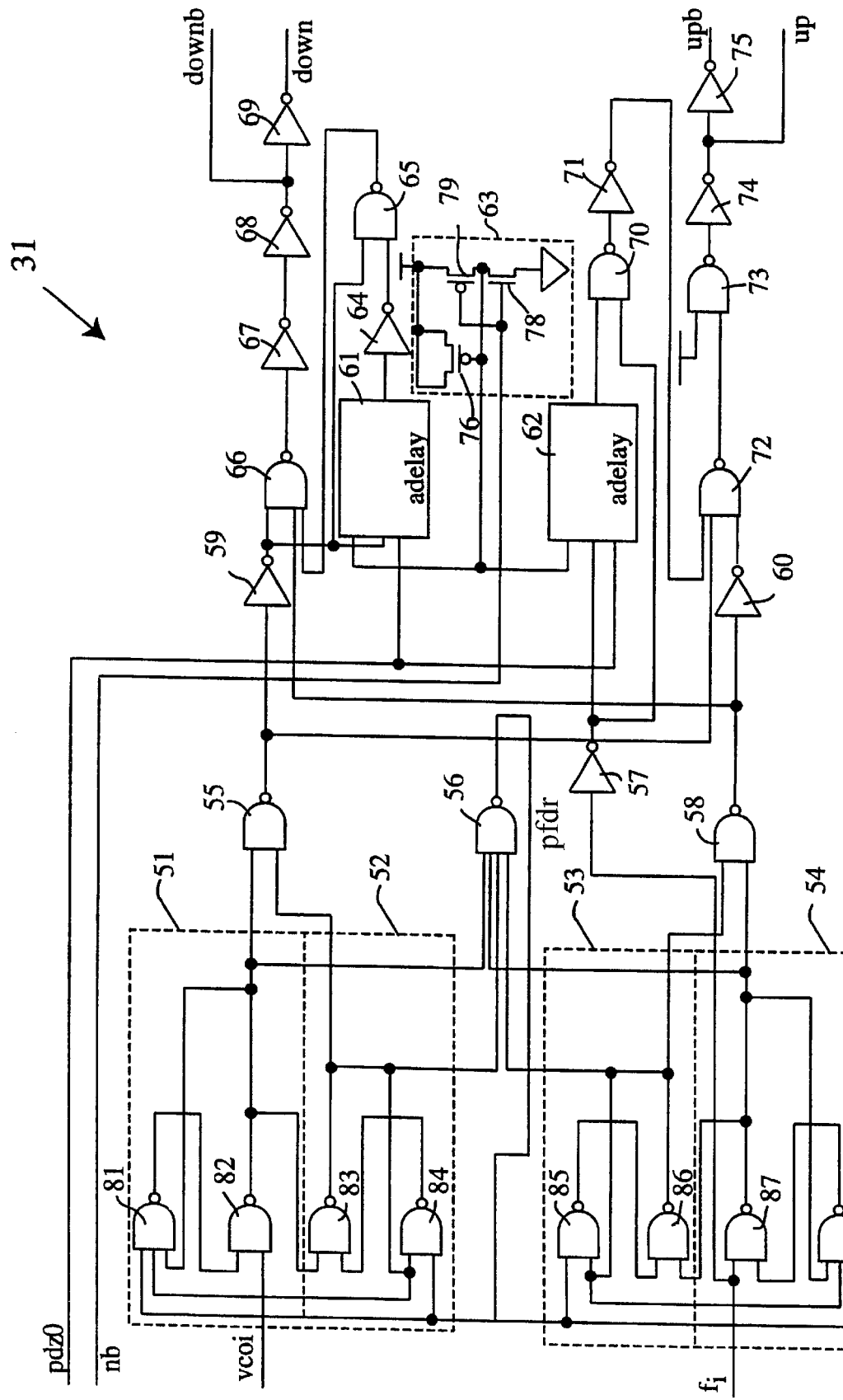
FIG. 3 is a circuit diagram of the phase frequency detector circuit in FIG. 2, according to the present invention.

FIG. 3 is a diagram of the phase frequency detector circuit 31 of FIG. 2 according to the present invention. In particular, phase frequency detector circuit 31 receives frequency signals vcoi and fi for comparison respectively from third divider 34 and first divider 30 of FIG. 2. Phase frequency detector circuit 31 includes first through fourth latches 51 through 54. Frequency signal vcoi is provided to a first input connection of first latch 51, connecting the output of third divider 34 to the input of first latch 51. Further, frequency signal fi is provided to a first input connection fourth latch 54, connecting the output of first divider 31 to the input of fourth latch 54. Phase frequency detector circuit 31 further includes NAND gate 55, NAND gate 56, inverter 57, NAND gate 58, and inverters 59 and 60. The outputs of latches 51 and 52 are connected to the input of NAND gate 55. The outputs of latches 53 and 54 are connected to NAND gate 58. The outputs of latches 51 through 54 are connected to NAND gate 56. Input frequency signal fi is connected to the input of inverter 58, thereby connecting inverter 58 to the output of first divider 30. The output of NAND gate 56 is connected to second input connections of first and fourth input latches 51 and 54 and first input connections of second and third input latches 52 and 53, to permit resetting of first through fourth latches 51–54 with signal pfdr. The output of second latch 52 is further connected to a third input of first latch 51, and the output of first latch 51 is connected to a second input of second latch 52. Further, the output of third latch 53 is connected to a third input of fourth latch 54, and the output of fourth latch 54 is connected to a second input of third latch 53. Phase frequency detector circuit 31 further includes first and second delay circuits 61 and 62 respectively connected to the outputs of inverters 59 and 57, and further bias circuit 63 which is connected to the inputs of delay circuits 61 and 62. Second delay circuit 62 is connected to inverter 57 rather than inverter 60, to resolve a start-up problem beginning with power-up from zero (0) volts. When this happens, the vcoi input frequency is almost zero (i.e., approximately 1 ms period). Since NAND gate 56 must reset before further output signaling can occur, the charge injected is too small and leaks off before the 1 ms reset pulse can be applied. Thus, the voltage applied to the input of the VCO never can go to an adequate level, because the charge keeps leaking off. To address this problem, a constant pulse signal is input to the UP output. Thus, every cycle, when fi goes low, inverter 57 goes high, activating delay circuit 62 to produce a high output, driving NAND gate 70 high, causing inverter 71 to go low, activating NAND gate 72, and producing an UP output signal. However, this signal will only remain on until either timer circuit 62 goes low or when the vcoi input is toggled causing NAND gate 72's B input to go low and forcing NAND gate 72 high. Phase frequency detector circuit 31 further includes inverter 64, NAND gate 65, NAND gate 70 and inverter 71. Phase frequency detector circuit 31 further includes NAND gate 66 and inverters 67 through 69, and NAND gates 72 and 73 and inverters 74 and 75, connected to each other in respective series. The output of delay circuit 61 is connected to the input of inverter 64, and the outputs of inverters 59 and 64 are connected as input to NAND gate 65. The output of NAND gate 65 is connected as an input to NAND gate 66. The outputs of delay circuit 62 and inverter 57 are connected as inputs of NAND gate 70, and the output of NAND gate 70 is connected to the input of inverter 71, which in turn is connected at its output as an input to NAND gate 72. Bias circuit 63 includes first, second, and third transistors respectively 76 through 78, transistors 76 and 77 being p-channel transistors and transistor 78 being an n-channel transistor. P-channel transistors 76 and 77 are connected to VCC and n-channel transistor 78 is connected to VSS, and p-channel transistors 76 and 77 are connected to each other at their bases and to a common node between p-channel and n-channel transistors 76 and 78. The common node is connected as an input to each of delay circuits 61 and 62. Phase frequency detector circuit 31 provides an up signal at the connection node between inverters 74 and 75 and a down signal at the output of inverter 69. First latch 51 includes first and second NAND gates 81 and 82 resectively. Second latch 52 includes first and second NAND gates 83 and 84 respectively. Third latch 53 includes first and second NAND gates 85 and 86 respectively. Fourth latch 54 includes first and second NAND gates 87 and 88 respectively. First and second NAND gates 81 and 82, 83 and 84, 85 and 86, and 87 and 88 are cross coupled, so that the output of gate 81 is an input to gate 82 and the output of 82 is an input of gate 81. Similarly, the output of gate 83 is an input to gate 84 and the output of 84 is an input of gate 83. Likewise, the output of gate 85 is an input to gate 86 and the output of 86 is an input of gate 85. Further, the output of gate 87 is an input to gate 88 and the output of 88 is an input of gate 87.

Figure 4:
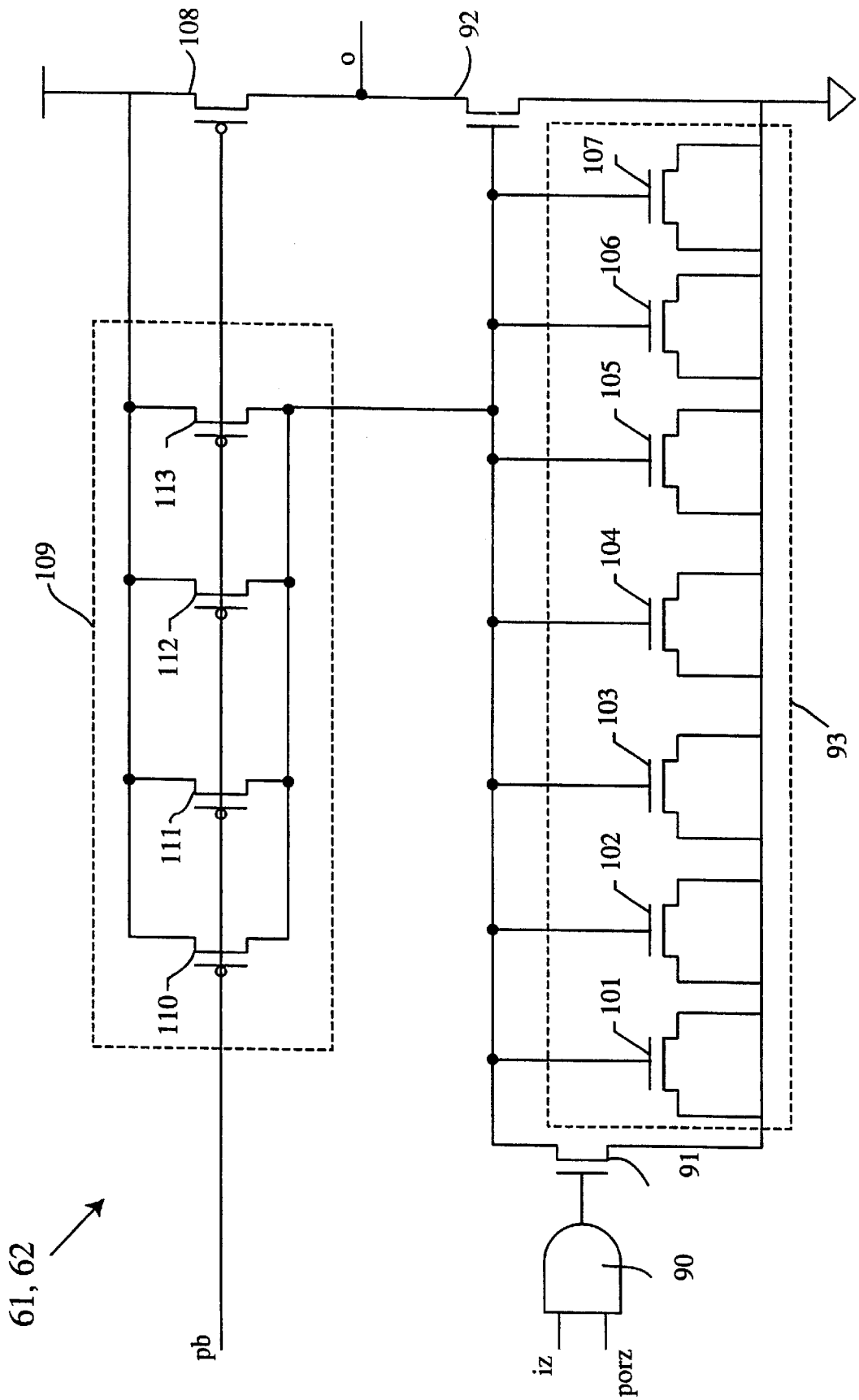
FIG. 4 is a circuit diagram of the details of delay circuits in the phase frequency detector circuit according to the present invention.

FIG. 4 is a circuit diagram of the details of delay circuits 61 and 62 in the phase frequency detector circuit according to the present invention, which start timing of a fixed delay based on low to high transitions on respective inverters 59 and 60 shown in FIG. 3. Delay circuits 61 and 62 each include a NAND gate 90, n-channel CMOS transistors 91 and 92, capacitance block 93 including first through seventh transistors 101–107, p-channel transistor 108, and current ratioed transistor block 108 including first through fourth p-channel transistors 110 through 113. P-channel transistor 108 is connected to n-channel transistor 107 at output node c1. Similarly, current ratioed transistor block 108 is connected to capacitance block 93 at central node cc. The current provided to node cc is a function of the number of transistors connected in current ratioed transistor block 108. Notably, the gates of fourth through seventh transistors 104–107 are connected to central node cc, while the gates of first through third transistors 101–103 are disconnected. Accordingly, the capacitance expressed at node cc is a function of three connected transistors and these transistors define the rise time of node cc. Each of delay circuits 61 and 62 receives input signals pb, iz, and porz. The porz input is used during a power-on reset to prevent operation of delay circuits 61 and 62 and to start the phase lock loop subcircuit 13 operating at initially low frequencies during a power-on reset condition. The pb input signal provides a PMOS bias voltage to current ratioed transistor block 108 including first through fourth p-channel transistors 110 through 113. The iz input signal is the output state of inverter 59 in the case of delay circuit 66 and the output state of inverter 57 in the case of delay circuit 62. In normal operation, the porz input is high. Thus, when the output of inverter 59 or 60 goes high, transistor 91 is turned off. While transistor 91 is in an on state, the voltage at node cc will be at zero (0) volts, because the current through transistor 91 is much greater than the current through transistors 110–113 of current ratioed transistor block 108. After transistor 91 is turned off, the cc node will start to rise in voltage at a rate of Itotal/Ccc, where Itotal is the total current output from transistors 110–113 and Ccc is the total capacitance contributed by those of transistors 101–107 which have their gates connected to node cc. When the cc node voltage rises to Vgsi7, then node c1 goes low. The Vgsi7 voltage trip point depends on the bias current in transistor 108. The delay time is approximately equal to Vgsi7*(Ccc/(Itotal)). When output node c1 of delay circuit 61 or 62 goes low before reset of NAND gate 56 occurs, then the respective NAND gate 65 and 70 outputs will turn off respective NAND gates 66 and 72, thus deactivating the DOWN or UP signals at the output of phase frequency detection circuit 31.

Figure 5A:
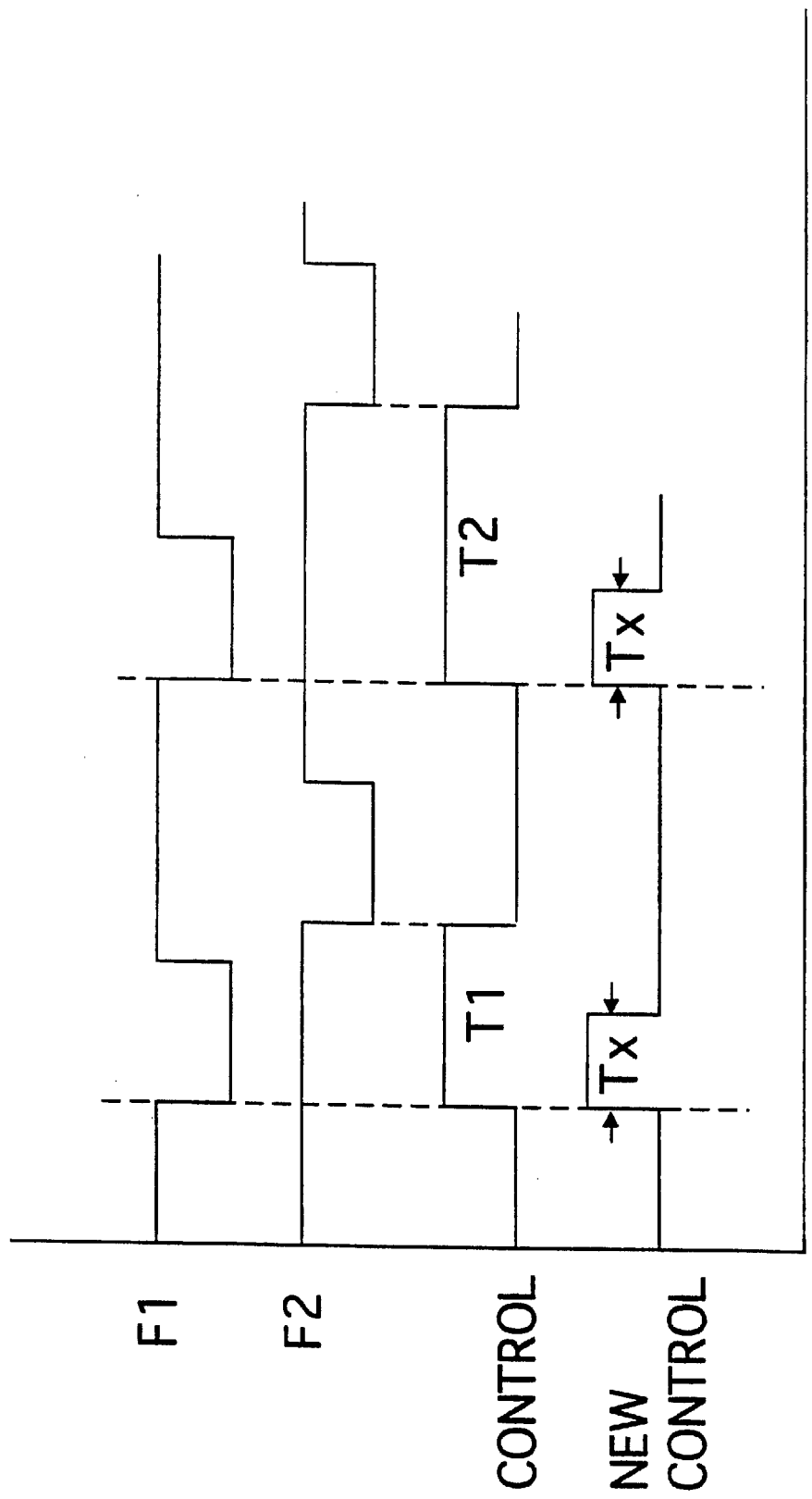
FIGS. 5a and 5b are timing diagrams illustrating voltage versus time of first and second different out-of-phase input frequencies input to a phase frequency detector circuit according to the prior art as well as one according to the present invention, and comparing output control signals from the respective phase frequency detector circuits.
Figure 5B:
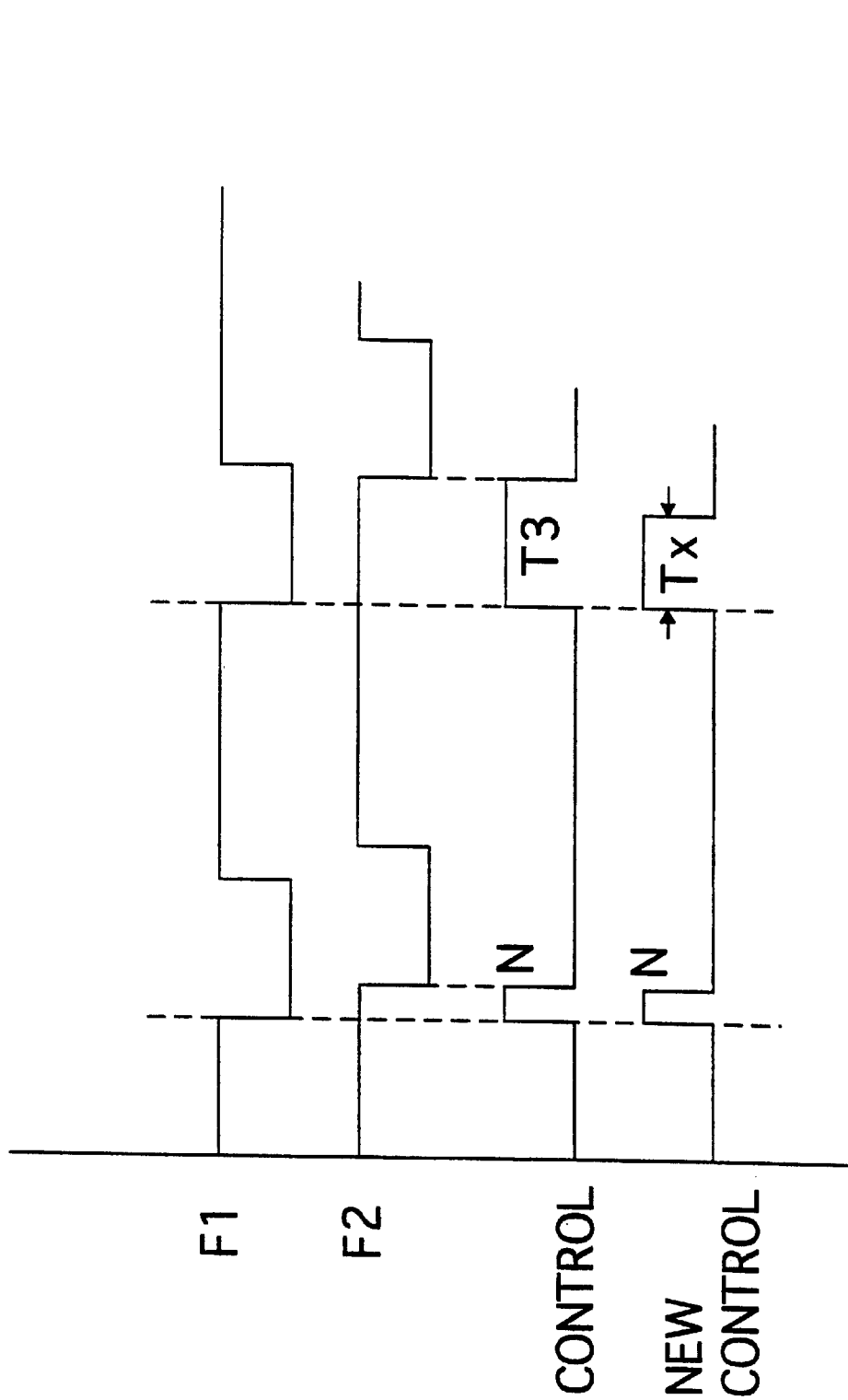

FIGS. 5*a* and 5*b* are timing diagrams illustrating voltage versus time of first and second different out-of-phase input frequencies input to a phase frequency detector circuit according to the prior art as well as a phase frequency detector circuit 31 according to the present invention, and comparing output control signals from the respective phase frequency detector circuits. In particular, FIG. 5*a* shows first and second frequency signals F1 and F2 (e.g., vcoi and fi respectively in FIG. 2) which are provided both to a hypothetical phase frequency detector circuit of the prior art and also to phase frequency detector 31 according to the present invention. Shown below the F1 and F2 traces in FIG. 5*a* are CONTROL and NEW CONTROL respectively signals produced respectively by the hypothetical phase frequency detector circuit of the prior art and the phase frequency detector 31 according to the present invention. The CONTROL trace produced according to the prior art circuit includes broad pulses T1 and T2 which indicate that a control signal from the phase frequency detector circuit of the prior art can be in an "on" state for a considerable time. The NEW CONTROL trace produced according to the present invention includes predetermined pulses Tx, indicating that a control signal from the phase frequency detector circuit of the present invention is in an "on" state for a predetermined, or limited, time. According to one embodiment of the present invention, the period of time Tx is limited to a short predetermined time which is controllably settable. In FIG. 5*a*, traces CONTROL and NEW CON-TROL trigger control signal output pulses, whether T1, T2, or Tx, as the case may be, at a first edge of appearance. This first edge of appearance may be termed the leading edge, the falling edge, the negatively rising edge, or whatever is appropriate. An alternate embodiment of the present invention triggers the particular control signals by another selected convention, such as the final or trailing edge, or otherwise as appropriate. As shown in FIG. 5*a*, the control pulses produced under the prior art may vary considerably in length or width, while in accordance with the present invention, the control signals are controllably settable to no more than fixed, and desirably short time lengths, i.e., Tx. FIG. 5*b* shows a circumstance according to the present invention in which a NEW CONTROL pulse can be less than Tx. This is caused by F2 following F1 by less than Tx to form a pulse of width "N." In this circumstance, the NEW CONTROL pulse is of the same pulse width "N," because the Tx width is only a pulse width setting which cannot be exceeded.

As a result of being able to shorten the on times of the control signals for altering operational frequency, it is possible to control how fast a circuit can switch from one operating frequency to another. Such slow switching is required, because the circuit being switched from one operational frequency to another may have circuit components or elements which do not respond sufficiently rapidly in smooth or continuous operation from one operational frequency to another.

What is claimed is:
1. A phase frequency detection circuit comprising:
  first, second, third and fourth latches, said first latch receiving a first input frequency signal at a first input thereof and said fourth latch receiving a second frequency signal at a first input thereof, an output of said first latch being connected to a first input of said second latch and an output of said second latch being connected to a second input of said first latch, an output of said third latch being connected to a second input of said fourth latch and the output of said fourth latch being connected to a first input of said third latch;
  first and second logic gates, wherein the outputs of said first and second latches are connected to said first logic gate at respective first and second inputs thereof and the outputs of said third and fourth latches are connected to said second logic gate at respective first and second inputs thereof, said first and second logic gates producing output signals for adjusting the output frequency of a voltage controlled oscillator; and
  delay circuitry connected to the outputs of said first and second logic gates and coupled to third inputs of the first and second logic gates to generate a disable signal to prevent production of adjustment signals after a predetermined control period.

2. The phase frequency detection circuit according to claim 1, further including a third logic gate having four inputs connected to the respective outputs of said first, second, third, and fourth latches, said third logic gate producing a reset signal applied to reset inputs of each of said first through fourth latches.

3. A phase frequency detection circuit for comparing frequency signals, comprising:
  a first latch having a first input, having a second input for receiving a first input frequency signal, and having an output;
  a second latch having an input coupled to the output of the first latch and having an output coupled to the first input of the first latch;

a third latch having an input and having an output;

a fourth latch having a first input coupled to the output of the third latch, having a second input for receiving a second frequency signal and having an output coupled to the input of the third latch;

a delay circuit having first and second inputs, and having first and second outputs for providing, after a predetermined control period, first and second disable signals, respectively, in response to application of signals to said first and second inputs;

a first logic circuit having first and second inputs coupled to respective outputs of the first and second latches, respectively, having a third input coupled to the first output of the delay circuit and having an output coupled to the first input of the delay circuit for providing a first output signal for adjusting the output frequency of a voltage controlled oscillator when the first disable signal is in a first state and not providing the first output signal when the first disable signal is in a second state; and a second logic circuit having first and second inputs coupled to the outputs of the third and fourth latches, respectively, having a third input coupled to the second output of the delay circuit and having an output coupled to the second input of the delay circuit for providing a second output signal for adjusting the output frequency of said voltage controlled oscillator when the second disable signal is in a first state and not providing the second output signal when the second disable signal is in a second state.

4. The phase frequency detection circuit of claim 3 wherein the first, second, third, and fourth latches each have another input and further comprising a third logic circuit having first, second, third, and fourth inputs coupled to the respective outputs of the first, second, third, and fourth latches and having an output coupled to said another inputs of the first, second, third, and fourth latches for applying a reset signal.

\* \* \* \* \*